(12) United States Patent
Satoi et al.

(10) Patent No.: US 9,024,513 B2
(45) Date of Patent: May 5, 2015

(54) MULTI-LAYER PIEZOELECTRIC ELEMENT, AND INJECTION DEVICE AND FUEL INJECTION SYSTEM USING THE SAME

(75) Inventors: Shinsaku Satoi, Kirishima (JP);
Masahiro Inagaki, Kirishima (JP);
Katsuhiko Hanada, Kirishima (JP)

(73) Assignee: Kyocera Corporation, Kyoto (JP)

( * ) Notice: Subject to any disclaimer, the term of this patent is extended or adjusted under 35 U.S.C. 154(b) by 365 days.

(21) Appl. No.: 13/511,212

(22) PCT Filed: Oct. 28, 2010

(86) PCT No.: PCT/JP2010/069203
§ 371 (c)(1),
(2), (4) Date: Jul. 18, 2012

(87) PCT Pub. No.: WO2011/065182
PCT Pub. Date: Jun. 3, 2011

(65) Prior Publication Data
US 2012/0280057 A1 Nov. 8, 2012

(30) Foreign Application Priority Data
Nov. 26, 2009 (JP) .................................. 2009268217

(51) Int. Cl.
*H01L 41/047* (2006.01)
*H01L 41/083* (2006.01)
*F02M 51/06* (2006.01)

(52) U.S. Cl.
CPC ........ *H01L 41/0472* (2013.01); *H01L 41/0838* (2013.01); *F02M 51/0603* (2013.01)

(58) Field of Classification Search
USPC .......................................... 310/328, 365, 366
See application file for complete search history.

(56) References Cited

U.S. PATENT DOCUMENTS 6,794,800 B1 *  9/2004  Heinz ........................... 310/366
2001/0047796 A1  12/2001  Yamada et al.
(Continued)

FOREIGN PATENT DOCUMENTS

CN         1659719 A        8/2005
CN     201234216 A        5/2009
(Continued)

OTHER PUBLICATIONS

Chinese Office Action with English concise explanation thereof, Chinese Patent Application No. 201080053440.3, Nov. 19, 2013, 7 pp.

*Primary Examiner* — Derek Rosenau
(74) *Attorney, Agent, or Firm* — Volpe and Koenig, P.C.

(57) ABSTRACT

A multi-layer piezoelectric element includes a stacked body including piezoelectric layers and internal electrode layers, which are alternately stacked; an external electrode layer attached to a side surface of the stacked body, the external electrode layer being elongated in a stacking direction of the stacked body and electrically connected with ends of the internal electrode layers which are exposed on the side surface; and an external electrode plate bonded to the external electrode layer therealong by an electrically conducting bonding material. The external electrode plate is provided with slits which extend from opposite long sides toward a center thereof in such a manner that tips of the respective slits overlap each other when viewed in the stacking direction of the stacked body, and a portion thereof where the tips of the respective slits overlap each other is provided with a hole extending along an extension direction of the slit.

15 Claims, 11 Drawing Sheets

(56) References Cited

U.S. PATENT DOCUMENTS

| | | | |
|---|---|---|---|
| 2002/0043901 A1* | 4/2002 | Kihara et al. | 310/366 |
| 2002/0158552 A1* | 10/2002 | Nakamura et al. | 310/328 |
| 2006/0055288 A1 | 3/2006 | Heinzmann et al. | |
| 2006/0091766 A1* | 5/2006 | Mochizuki et al. | 310/366 |
| 2006/0232172 A1* | 10/2006 | Asano et al. | 310/366 |
| 2009/0000597 A1 | 1/2009 | Kronberger | |
| 2010/0259134 A1 | 10/2010 | Hohmann et al. | |

FOREIGN PATENT DOCUMENTS

| | | |
|---|---|---|
| JP | 8242025 A | 9/1996 |
| JP | 2002061551 A | 2/2002 |
| JP | 200386853 A | 3/2003 |
| JP | 2005529495 | 9/2005 |
| JP | 2006203070 A | 8/2006 |
| JP | 2009534823 A | 9/2009 |

* cited by examiner (a)

(b)

(c)

(d)

(e)

(f)

MULTI-LAYER PIEZOELECTRIC ELEMENT, AND INJECTION DEVICE AND FUEL INJECTION SYSTEM USING THE SAME

TECHNICAL FIELD

The present invention relates to a multi-layer piezoelectric element for use as, for example, a piezoelectric driving element (piezoelectric actuator), a pressure sensor element, a piezoelectric circuit element, and the like, as well as to an injection device and a fuel injection system using the multi-layer piezoelectric element.

BACKGROUND ART

There is a heretofore known multi-layer piezoelectric element including: a stacked body including piezoelectric layers and internal electrode layers, these layers being alternately stacked; an external electrode layer attached to a side surface of the stacked body, the external electrode layer being elongated in a stacking direction of the stacked body, the external electrode layer being connected with ends of the internal electrode layers which are exposed on the side surface; and an external electrode plate bonded to the external electrode layer therealong by an electrically conducting bonding material.

The multi-layer piezoelectric element is obtained by printing an electrically conducting paste constituting internal electrode layers on to ceramic green sheets; preparing a stacked compact by stacking the ceramic green sheets bearing the electrically conducting paste on top of each other; firing the stacked compact and subjecting it machining process such as grinding process; preparing an external electrode layer; and bonding an external electrode plate by an electrically conducting bonding material.

In this example, it has been suggested that resin silver having a composition of 80% silver and 20% epoxy-based resin is used as the electrically conducting bonding material, and a metal plate provided with slits or a metal plate formed with holes is used as the external electrode plate (refer to Patent Literature 1).

In Patent Literature 1, as the metal plate provided with slits, there is described a metal plate provided with a plurality of slits that are alternately aligned in parallel with the piezoelectric layer and the internal electrode layer. The slits extend from the opposite long sides of the metal plate toward the center thereof in such a manner that tips of the respective slits overlap each other alternately as seen in the stacking direction of the stacked body. The examples of the slit described therein include slits of various shapes such as a round shape, a triangular shape, and a rectangular shape, a slit having the form of a combination of the different shapes, and a slit with a circularly-shaped interior. Moreover, as the metal plate formed with holes, there is described a metal plate provided with round holes, rectangular holes, hexagonal holes, elliptical holes, oblique holes, and so forth.

CITATION LIST

Patent Literature

Patent Literature 1: Japanese Unexamined Patent Publication JP-A 2002-61551

DISCLOSURE OF INVENTION

Technical Problem

However, the multi-layer piezoelectric element employing the metal plate provided with slits as the external electrode plate poses the following problems. That is, when the multi-layer piezoelectric element is driven to operate, the external electrode plate is subjected to a stress acting to cause warpage around the opposite long sides thereof, thereby urging the external electrode plate in a direction away from the stacked body. In consequence, cracks are developed in the electrically conducting bonding material for bonding the external electrode layer with the external electrode plate, which results in breaking. Due to electric discharge occurring in its broken area, the electrically conducting bonding material suffers from burnout or generation of noise. Furthermore, the stacked body could cease stable displacement because of a failure of uniform transmission of input signals (voltage) to each and every internal electrode layer.

On the other hand, the multi-layer piezoelectric element employing the metal plate provided with holes as the external electrode plate poses the following problem. That is, the external electrode plate has a low degree of flexibility in the design of its opposite long sides, and is therefore unable to adapt itself to the displacement of the stacked body successfully.

The invention has been devised in view of the circumstances as mentioned supra, and accordingly an object of the invention is to provide a multi-layer piezoelectric element in which an external electrode plate can adapt itself to displacement of a stacked body successfully and development of cracks and occurrence of breaking in an electrically conducting bonding material can thus be suppressed, as well as to provide an injection device and a fuel injection system using the multi-layer piezoelectric element.

Solution To Problem

The invention provides a multi-layer piezoelectric element, including: a stacked body including piezoelectric layers and internal electrode layers, the piezoelectric layers and the internal electrode layers being stacked; an external electrode layer attached to a side surface of the stacked body, the external electrode layer being elongated in a stacking direction of the stacked body, the external electrode layer being connected with ends of the internal electrode layers which are exposed on the side surface; and an external electrode plate bonded to the external electrode layer therealong by an electrically conducting bonding material, wherein the external electrode plate is provided with a plurality of slits which extend from opposite long sides of the external electrode plate toward a center thereof in such a manner that tips of the respective slits overlap each other when viewed in the stacking direction of the stacked body, and a portion of the external electrode plate where the tips of the respective slits overlap each other alternately is provided with a hole extending along an extension direction of the slit.

In the multi-layer piezoelectric element of the invention, it is preferable that opposite ends of the hole along the extension direction of the slit are each located midway between the tip of the slit and the long side of the external electrode plate opposed to the tip when viewed in the stacking direction of the stacked body.

In the multi-layer piezoelectric element of the invention, it is preferable that a width of the hole in the stacking direction and a width of the slit in the stacking direction are each greater than a distance between the slit and the hole.

In the multi-layer piezoelectric element of the invention, it is preferable that the electrically conducting bonding material is so configured that one part lies between the external electrode layer and the external electrode plate and the other part lies outside the external electrode plate, and these parts merge through the hole and the portion of the external electrode plate where the tips of the respective slits overlap each other alternately.

In the multi-layer piezoelectric element of the invention, it is preferable that the electrically conducting bonding material extends along the center of the external electrode plate while covering the hole and the portion of the external electrode plate where the tips of the respective slits overlap each other alternately, and part of the slit located near the long side is exposed.

In the multi-layer piezoelectric element of the invention, it is preferable that the electrically conducting bonding material is placed between the external electrode layer and the external electrode plate, and the electrically conducting bonding material extends through the hole and the portion of the external electrode plate where the tips of the respective slits overlap each other alternately, outward beyond the external electrode plate.

In the multi-layer piezoelectric element of the invention, it is preferable that the electrically conducting bonding material lies inside the hole, and the electrically conducting bonding material lying inside the hole is provided with a pore.

In the multi-layer piezoelectric element of the invention, it is preferable that the pore is an open pore.

In the multi-layer piezoelectric element of the invention, it is preferable that the pore is semicircular or semielliptical in section when viewed perpendicularly to the side surface of the stacked body.

In the multi-layer piezoelectric element of the invention, it is preferable that a width of the pore in the stacking direction coincides with a width of the hole in the stacking direction.

In the multi-layer piezoelectric element of the invention, it is preferable that the pore is provided in a midportion of the hole in a width direction parallel to the extension direction of the slit.

In the multi-layer piezoelectric element of the invention, it is preferable that the electrically conducting bonding material lies within the portion of the external electrode plate where the tips of the respective slits overlap each other alternately, and the electrically conducting bonding material lying inside the slit is provided with a pore.

In the multi-layer piezoelectric element of the invention, it is preferable that the stacked body includes a to-be-broken layer which is preferentially broken rather than the internal electrode layer during driving, and the pore is provided in a portion of the electrically conducting bonding material corresponding to the to-be-broken layer.

Moreover, the invention provides an injection device including: a container including an injection hole; and the multi-layer piezoelectric element mentioned above, a fluid stored in the container being configured to be injected through the injection hole by driving the multi-layer piezoelectric element.

Further, the invention provides a fuel injection system including: a common rail configured to store a high-pressure fuel; the injection device of the invention, configured to inject the high-pressure fuel stored in the common rail; a pressure pump configured to supply the high-pressure fuel to the common rail; and an injection control unit configured to send a drive signal to the injection device.

Advantageous Effects of Invention

According to the invention, the external electrode plate is provided with a plurality of slits which extend from the opposite long sides of the external electrode plate toward the center thereof in such a manner that tips of the respective slits overlap each other alternately when viewed in the stacking direction of the stacked body. Moreover, the portion of the external electrode plate where the tips of the respective slits overlap each other alternately is provided with a hole extending along the extension direction of the slit. Thereby, it is possible to disperse a stress acting to cause warpage around the opposite long sides of the external electrode plate (a stress tending to separate the external electrode plate from the stacked body) in spite of good adaptability of the external electrode plate to the displacement of the stacked body. Accordingly, it is possible to suppress breaking of the electrically conducting bonding material due to development of cracks therein and occurrence of burnout or generation of noise in the electrically conducting bonding material due to electric discharge occurring in the broken area, and thereby suppress a failure of uniform transmission of input signals (voltage) to each and every internal electrode layer that will eventually render the stacked body incapable of stable displacement.

DESCRIPTION OF EMBODIMENTS

Hereinafter, an embodiment of the multi-layer piezoelectric element according to the invention will be described in detail with reference to the drawings.

Figure 1:
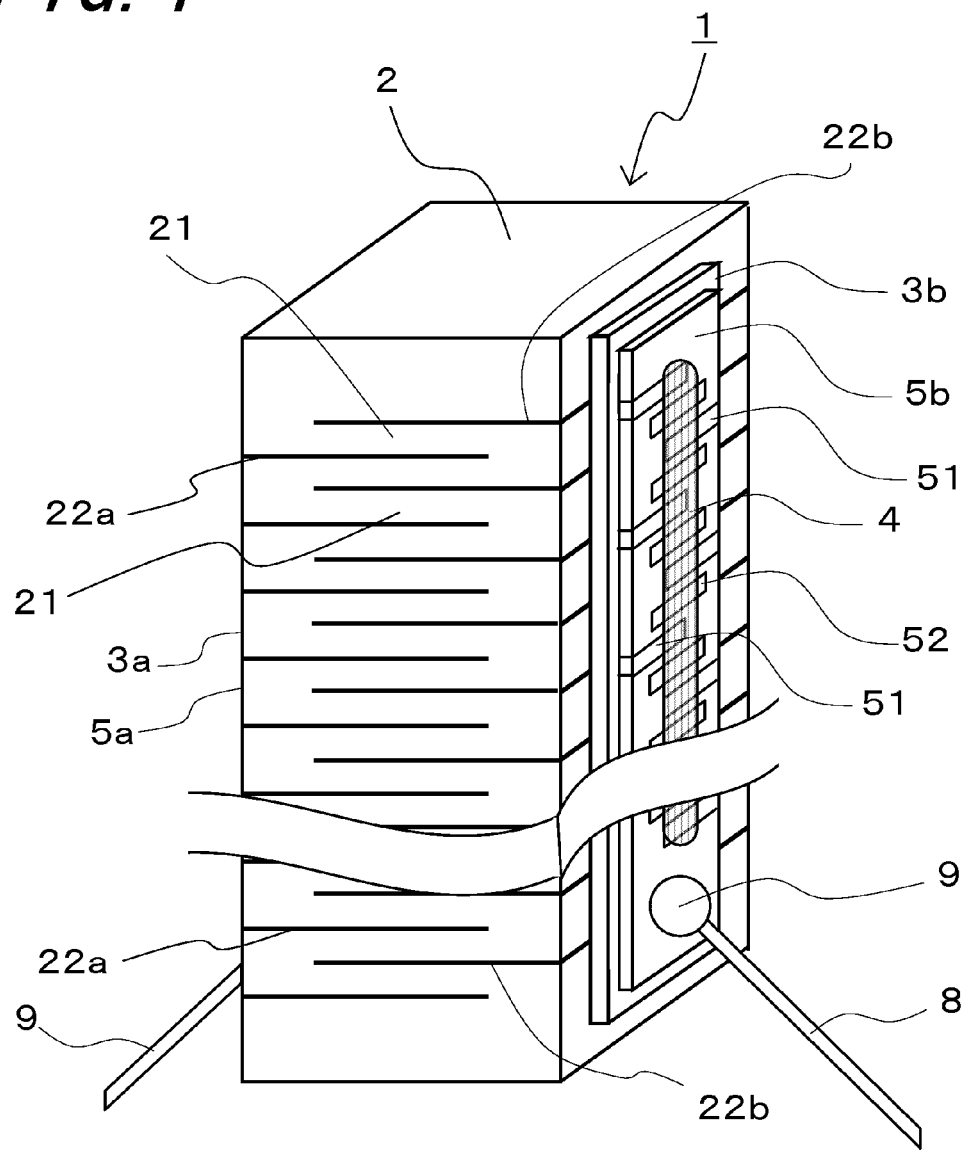
FIG. 1 is a perspective view showing an embodiment of the multi-layer piezoelectric element according to the invention.

FIG. 1 is a perspective view showing an embodiment of the multi-layer piezoelectric element according to the invention. As shown in FIG. 1, the multi-layer piezoelectric element 1 of the invention includes a stacked body 2 including piezoelectric layers 21 and internal electrode layers 22a and 22b, the piezoelectric layers 21 and the internal electrode layers 22a and 22b being stacked; external electrode layers 3a and 3b attached to their respective side surfaces of the stacked body 2, the external electrode layers 3a and 3b being elongated in a stacking direction of the stacked body, the external electrode layers 3a and 3b being connected with ends of the internal electrode layers 22a and 22b which are exposed on the side surfaces; and external electrode plates 5a and 5b bonded to the external electrode layers 3a and 3b, respectively, therealong by an electrically conducting bonding material 4. Although not shown in the drawing, an opposite surface, namely a surface opposed to the surface provided with the external electrode layer 3b and the external electrode plate 5b is provided with the external electrode layer 3a and the external electrode plate 5a.

For example, the stacked body 2 includes an active portion including the piezoelectric layers 21 and the internal electrode layers 22a and 22b, the piezoelectric layers 21 and the internal electrode layers 22a and 22b being alternately stacked, and an inactive portion including the piezoelectric layers 21 stacked at both ends of the active portion in the stacking direction. The stacked body 2 has a column which are 0.5 to 10 mm long, 0.5 to 10 mm wide, and 1 to 10 mm high, respectively, for example. The end of the internal electrode layer 22a and the end of the internal electrode layer 22b are exposed on the opposite side surfaces (opposed side surfaces), respectively, of the stacked body 2.

The piezoelectric layer 21 is made of ceramic having piezoelectric property. As such a ceramic material, for example, a perovskite-type oxide made of lead zirconate titanate (PZT: $PbZrO_3$—$PbTiO_3$), lithium niobate ($LiNbO_3$), or lithium tantalate ($LiTaO_3$) can be used.

The internal electrode layers 22a and 22b are prepared by means of co-firing together with the ceramic constituting the piezoelectric layer 21. As the material constituting the internal electrode layer, for example, a conductor composed predominantly of a silver-palladium alloy whose reactivity with piezoelectric ceramics is low, or a conductor containing copper, platinum, or the like can be used.

Figure 7:
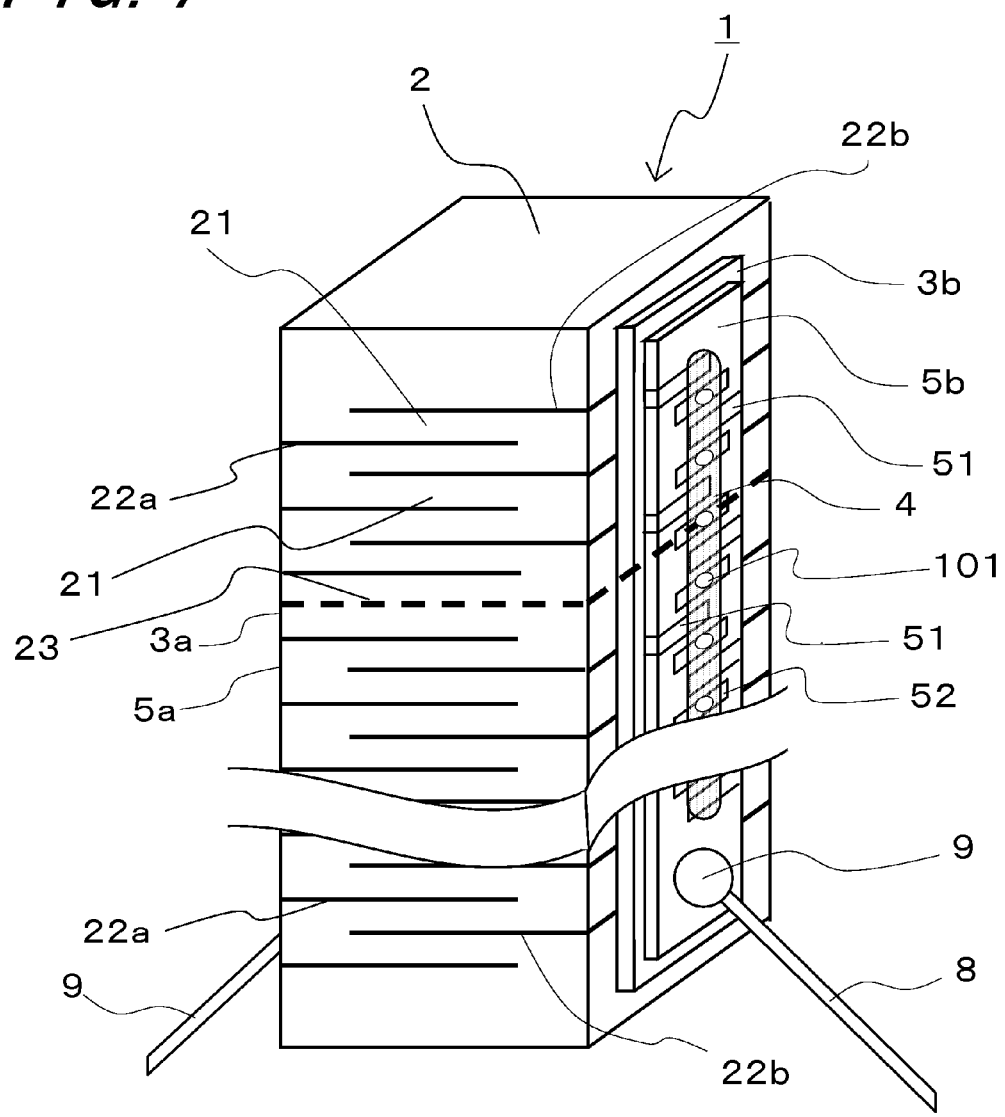
FIG. 7 is a perspective view showing another embodiment of the multi-layer piezoelectric element according to the invention.
Figure 9:
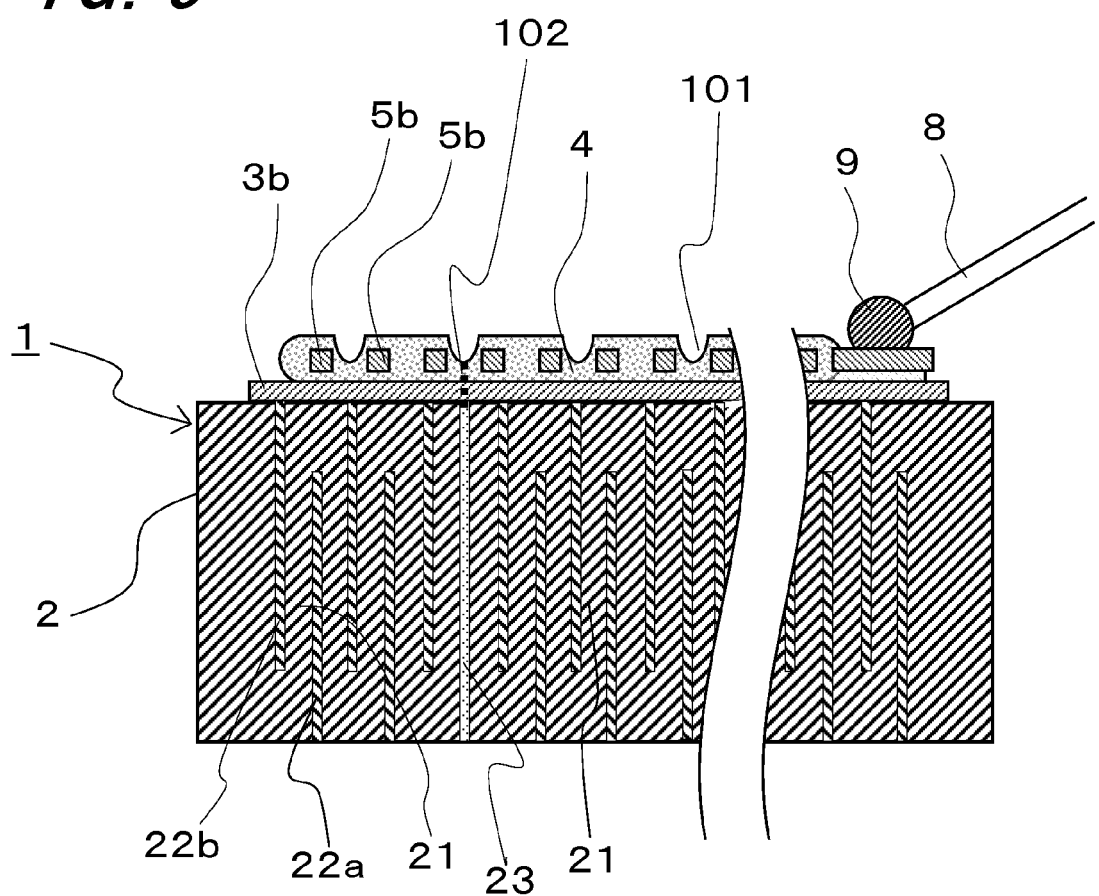
FIG. 9 is a schematic sectional view showing an example of the section of the multi-layer piezoelectric element shown in FIG. 7 in parallel with the stacking direction.

It is noted that, as shown in FIGS. 7 and 9, the stacked body 2 may be configured to include a to-be-broken layer 23, which is a layer that is preferentially broken rather than the internal electrode layer 22a, 22b during driving. There are placed a plurality of to-be-broken layers 23, preferably in a regularly-spaced arrangement, at least in one location between the two or more piezoelectric layers 21. The to-be-broken layer 23 is provided as a layer which is lower in strength than the internal electrode layer 22a, 22b and is thus prone to develop cracks under stress, for providing stress reduction capability. For example, the to-be-broken layer 23 is made of an insufficiently-sintered piezoelectric layer, a piezoelectric layer or metallic layer bearing many porosities, or a layer containing independently-distributed piezoelectric particles or metallic particles. The provision of such a to-be-broken layer 23 makes it possible to prevent development of cracks in the internal electrode layer 22a, 22b and the piezoelectric layer 21, because the to-be-broken layer 23 preferentially becomes cracked when a tensile stress is exerted in the stacking direction of the stacked body 2 as the result of extension behavior of the stacked body 2.

The external electrode layer 3a, 3b, which is elongated in the stacking direction, is formed for example by applying a paste made of silver and glass to a side surface of the stacked body 2 and then performing baking treatment thereon. The external electrode layer 3a is electrically connected to the ends of the internal electrode layers 22a which are exposed on the side surface, and the external electrode layer 3a is electrically connected to the ends of the internal electrode layers 22a which are exposed on the side surface.

The external electrode plate 5a, 5b is disposed along the external electrode layer 3a, 3b. The external electrode plate 5a is bonded to the external electrode layer 3a by the electrically conducting bonding material 4, and the external electrode plate 5b is bonded to the external electrode layer 3b by the electrically conducting bonding material 4.

The electrically conducting bonding material 4 is prepared by dispersing conductor-made fillers substantially evenly in thermosetting resin, more specifically, prepared by dispersing silver fillers substantially evenly in polyimide resin, for example. The external electrode plate 5a, 5b is made of metal such as stainless steel, phosphor bronze, or the like, and has a width of 0.5 mm to 10 mm and a thickness of 0.01 mm to 1.0 mm, for example.

The external electrode plate 5a, 5b is provided with a plurality of slits 51 which extend from the opposite long sides of the external electrode plate toward the center thereof in such a manner that tips of the respective slits overlap each other alternately when viewed in the stacking direction of the stacked body 2.

The slits 51 extend from one of the long sides, as well as from the other one of the long sides, of the external electrode plate 5a, 5b in alternate order, and have a width of 0.05 mm to 1 mm and a length of 0.3 mm to 9.5 mm, for example. In general, the slit 51 extending from one long side and the slit 51 extending from the other long side have the same length. As used herein, the term "overlap each other" means that the adjacent slits 51 are so arranged as to confront in part with each other as viewed in the stacking direction. More specifically, the representation that the tips of the respective slits overlap each other when viewed in the stacking direction means that at least part of that region of the slit 51 extending from one long side which constitutes one-half of the entire slit length located toward the tip overlaps with at least part of that region of the slit 51 extending from the other long side which constitutes one-half of the entire slit length located toward the tip. That is, the representation does not mean that the slits 51 are so arranged as to overlap each other only at their tips, and that the one-half region of the slit 51 extending from one long side and the one-half region of the slit 51 extending from the other long side overlap wholly with each other.

Figure 2:
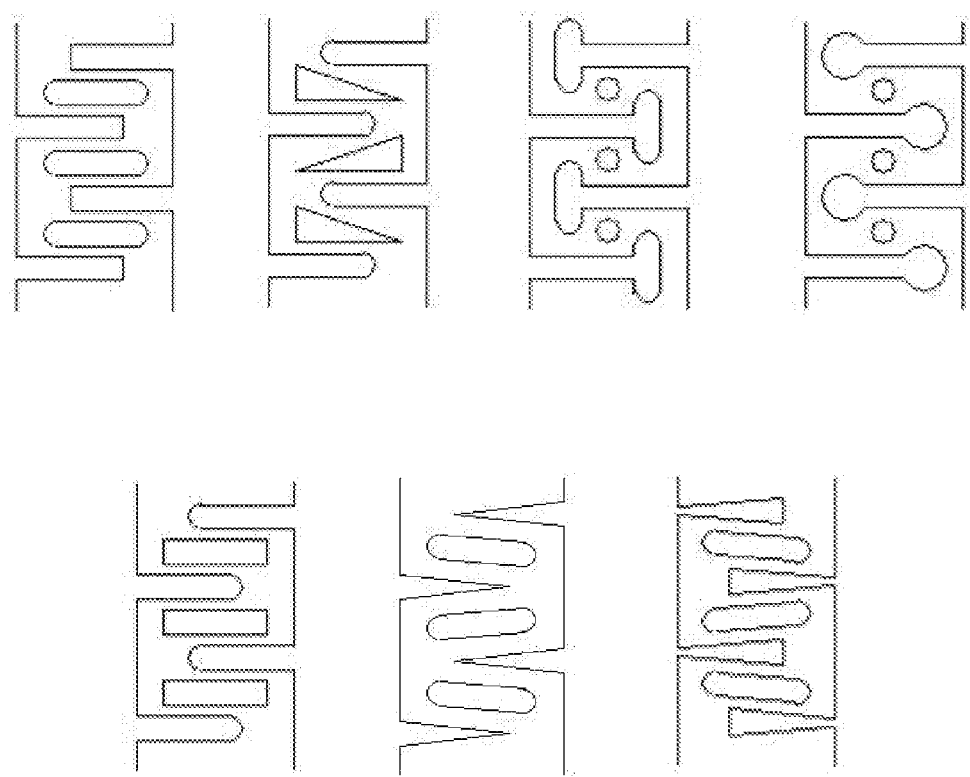
FIG. 2 is an explanatory view showing a variation of external electrode plates as shown in FIG. 1.

It is noted that, as shown in FIG. 2, the slit 51 may have either a flat-shaped tip or a rounded tip. Moreover, the slit 51 may have a tip made larger in width than the rest part thereof, or may be provided with a circular hole located at its tip, the diameter of which is greater than the width of the rest part. Further, the slit 51 may be tapered so as to be gradually narrowed in the direction toward the tip of the slit, or may be tapered so as to be gradually widened in the direction toward the tip of the slit. In this way, the slit 51 may be variously shaped.

Moreover, a portion of the external electrode plate where the tips of the respective slits 51 overlap each other alternately is provided with a hole 52 extending along an extension direction of the slit 51.

By providing the hole 52 in the portion of the external electrode plate where the tips of the respective slits 51 overlap each other alternately, it is possible to disperse a stress acting to cause warpage around the opposite long sides of the external electrode plate 5a, 5b (a stress tending to separate the external electrode plate from the stacked body) in spite of good adaptability of the external electrode plate 5a, 5b to the displacement of the stacked body 2. Accordingly, it is possible to suppress breaking of the electrically conducting bonding material 4 due to development of cracks therein and occurrence of burnout or generation of noise in the electrically conducting bonding material due to electric discharge occurring in the broken area, and thereby suppress a failure of uniform transmission of input signals (voltage) to each and every internal electrode layer that will eventually render the stacked body incapable of stable displacement. As used herein, the portion of the external electrode plate where the tips of the respective slits 51 overlap each other alternately refers to a part of the external electrode plate located between the confronting regions of the adjacent slits 51. If the hole 52 is provided only in a portion of the external electrode plate where the tips of the respective slits 51 do not overlap each other alternately, the stress acting on the opposite sides of the external electrode plate 5a, 5b cannot be dispersed thoroughly. Moreover, as used herein, the displacement refers to extension and contraction behaviors as observed during driving. Further, as used herein, the extension direction of the slit 51 refers to a direction longitudinally of the slit 51 extending from the long side of the external electrode plate 5a, 5b.

Figure 3:
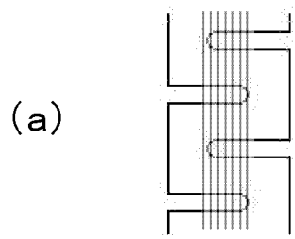
FIG. 3 is an explanatory view showing another variation of external electrode plates as shown in FIG. 1.
Figure 3:
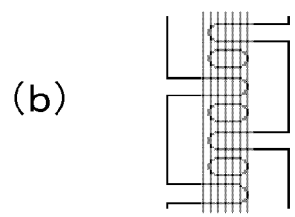
Figure 3:
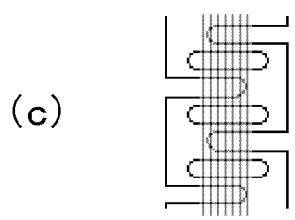
Figure 3:
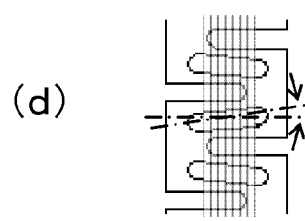
Figure 3:
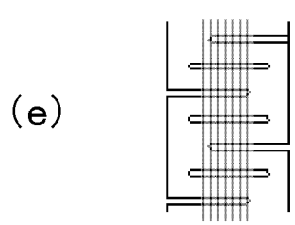
Figure 3:
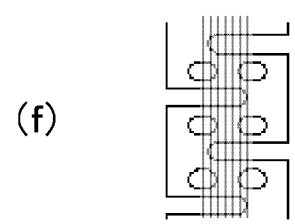

As shown in FIG. 2, the hole 52 may either be rectangular-shaped or have the shape of a rectangle having rounded ends. The hole 52 may also have the shape of a perfect circle, an ellipse, or a triangle. Moreover, the hole 52 may have its major axis inclined with respect to a direction perpendicular to the stacking direction. Further, either one hole 52 or two or more holes 52 may be provided between the slits 51. For example, in the case of providing two holes 52, while the two holes 52 may be provided so as to fit completely inside the portion of the external electrode plate where the slits 51 overlap each other when viewed in the stacking direction, as shown in FIG. 3(*f*), the two holes 52 may be provided so as to overlap in part with the portion of the external electrode plate where the slits 51 overlap each other when viewed in the stacking direction. In addition, although not shown in the drawings, it is also possible to provide two or more holes 52 so as to overlap each other in the stacking direction. In this way, the hole 51 may be variously shaped.

It is preferable that, as shown in FIGS. 3(*c*) and 3(*d*), the opposite ends of the hole 52 in the extension direction of the slit 51 are each located midway between the tip of the slit 51 and the long side of the external electrode plate 5a, 5b opposed to the tip when viewed in the stacking direction of the stacked body 2. In the case where the hole 52 is shaped like a flattened hole elongated in a width direction of the external electrode plate 5, since the hole 52 is opened in the stacking direction during driving, it follows that the stress acting to cause warpage around the opposite long sides of the external electrode plate 5a, 5b (the stress tending to separate the external electrode plate from the stacked body 2) can be dispersed more thoroughly. This makes it possible to suppress development of cracks in the electrically conducting bonding material 4 more reliably.

Moreover, it is preferable that the width of the hole 52 in the stacking direction and the width of the slit 51 in the stacking direction are each greater than the distance between the slit 51 and the hole 52. By adjusting the widths of the hole 52 and the slit 51 to be greater than the distance between the slit 51 and the hole 52, it is possible to allow the external electrode plate 5a, 5b to adapt itself to the displacement of the stacked body 2 more successfully, as well as to suppress development of cracks in the electrically conducting bonding material 4 more reliably.

Figure 4:
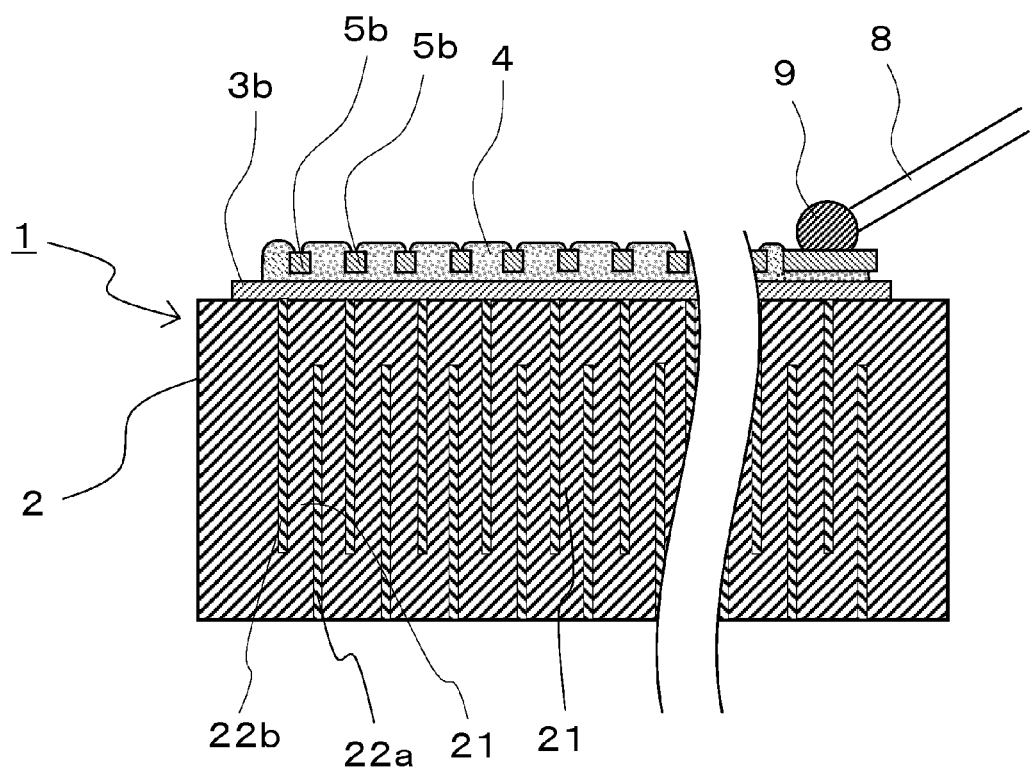
FIG. 4 is a schematic sectional view showing an example of the section of the multi-layer piezoelectric element shown in FIG. 1 in parallel with a stacking direction.
Figure 5:
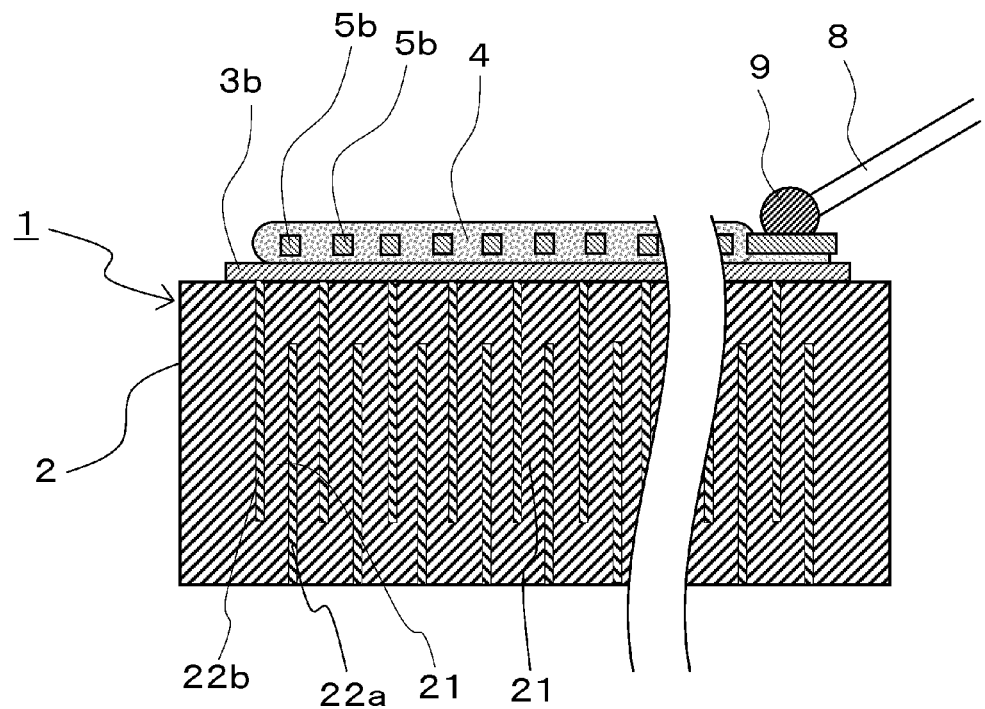
FIG. 5 is a schematic sectional view showing another example of the section of the multi-layer piezoelectric element shown in FIG. 1 in parallel with the stacking direction.

Further, it is preferable that, as shown in FIG. 4, the electrically conducting bonding material 4 is placed between the external electrode layer 3a, 3b and the external electrode plate 5a, 5b, and the electrically conducting bonding material 4 extends through the hole 52 and the portion of the external electrode plate where the tips of the respective slits 51 overlap each other alternately, outward beyond the external electrode plate 5a, 5b, or that, as shown in FIG. 5, the electrically conducting bonding material 4 is so configured that one part lies between the external electrode layer 3a, 3b and the external electrode plate 5a, 5b and the other part lies outside the external electrode plate 5a, 5b, and these parts merge through the hole 52 and the portion of the external electrode plate where the tips of the respective slits 51 overlap each other alternately. By virtue of such configurations, the bonding effect of the electrically conducting bonding material 4 can be obtained not only at the side of the contact surface of the external electrode plate 5a, 5b but also at the side of the opposite outer surface. Accordingly, in this case, as compared with the case of providing the electrically conducting bonding material 4 only in the region between the external electrode layer 3a, 3b and the external electrode plate 5a, 5b, a higher bonding strength can be attained. Note that, in FIGS. 4 and 5, elements such as the external electrode layer 3a, the external electrode plate 5a, the electrically conducting bonding material 4 for bonding them together are omitted.

Figure 6:
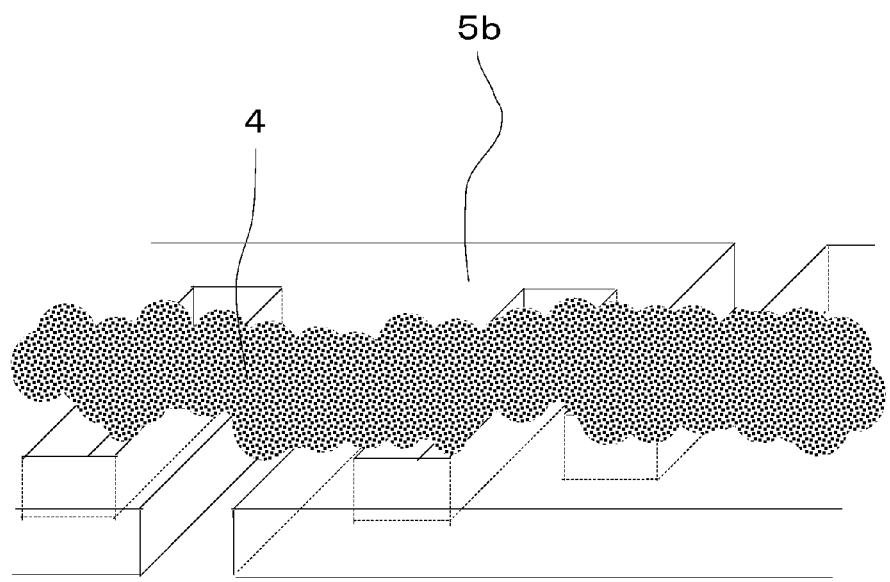
FIG. 6 is a perspective view showing a location at which is formed an electrically conducting bonding material as shown in FIG. 1.

Particularly, as shown in FIG. 6, the electrically conducting bonding material 4 should preferably extend along the center of the external electrode plate 5a, 5b while covering the portion of the external electrode plate where the hole 52 and the tip of the slit 51 overlap each other, so that part of the slit 51 located near the long side is exposed. By exposing part of the slit located near the long side of the external electrode plate 5a, 5b that becomes deformed most greatly during driving, it is possible to allow the external electrode plate 5a, 5b to adapt itself to the displacement of the stacked body 2 successfully, and thereby lessen the stress acting to cause warpage around the opposite long sides of the external electrode plate 5a, 5b. It is also possible to obtain the effect of suppressing warpage occurring around the opposite long sides of the external electrode plate 5a, 5b.

In the case where the electrically conducting bonding material 4 lies inside the hole 52 as described above, as shown in FIGS. 7 to 9, it is preferable that the electrically conducting bonding material 4 lying inside the hole 52 is provided with a pore 101.

Figure 8:
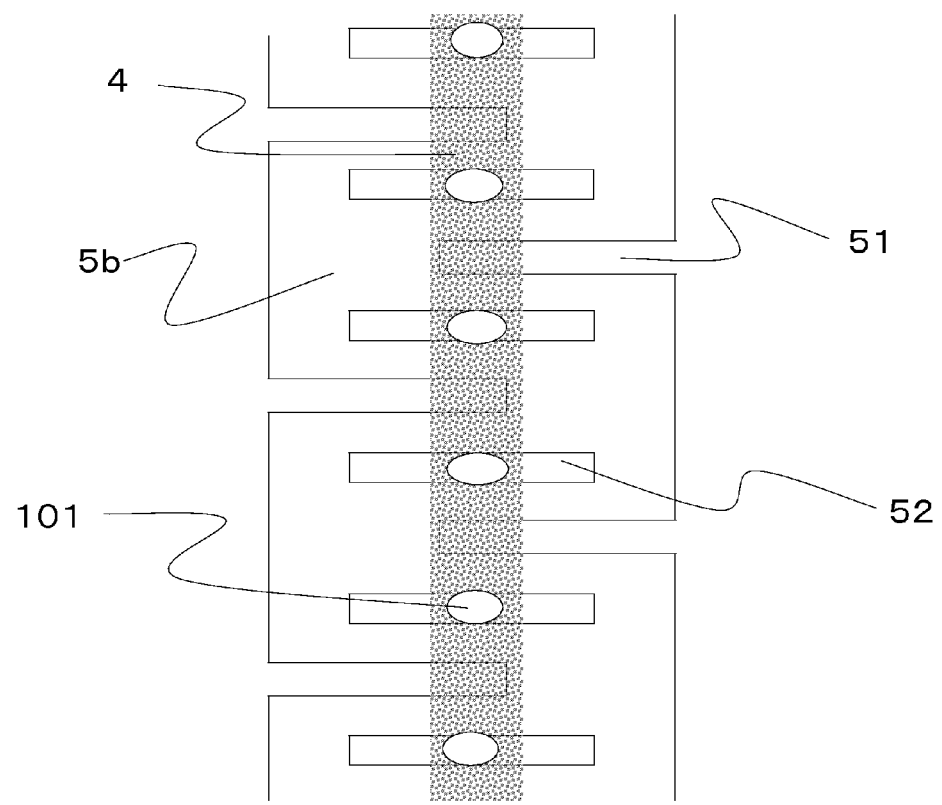
FIG. 8 is a front view of the external electrode plate and the electrically conducting bonding material shown in FIG. 7.

As the stacked body 2 undergoes extension and contraction during the driving of the multi-layer piezoelectric element 1, the external electrode plate 5a, 5b would adapt itself to the extension and contraction behaviors of the stacked body 2, especially the region around the hole 52 would become deformed. At this time, if the electrically conducting bonding material 4 is buried in the hole 52, under the restraint force exerted by the electrically conducting bonding material 4, that region of the external electrode plate 5a, 5b located around the hole 52 is restrained from deformation, thereby arresting the extension and contraction behaviors of the stacked body 2. With this in view, if the driving voltage is raised in compensation for the restraint on deformation, the self-heating temperature of the multi-layer piezoelectric element 1 will rise, with consequent separation of the external electrode plate 5a, 5b. In this regard, as shown in FIGS. 7 to 9, by providing the pore 101 in the electrically conducting bonding material 4 lying inside the hole 52, it is possible to lessen and minimize the restraint force exerted by the electrically conducting bonding material 4 buried in the hole 52, and thereby maintain stable driving condition without causing separation of the external electrode plate 5a, 5b.

In providing the pore 101 in the electrically conducting bonding material 4, it is possible to provide small-diameter pores in scattered arrangement. However, considering that the smaller the area of bonding between the electrically conducting bonding materials 4, the weaker the restraint force, it is desirable to provide a single large-diameter pore alone, in particular, a pore having a diameter large enough to make contact with the inner wall of the hole 52.

Moreover, as shown in FIG. 9, it is preferable that the pore 101 provided in the electrically conducting bonding material 4 lying inside the hole 52 is an open pore. By designing the pore 101 as an open pore, it is possible to obtain an even higher restraint-force lessening effect. In addition, the heat-dissipation effect can be enhanced with an increase in the surface area of the electrically conducting bonding material 4. Accordingly, the durability of the multi-layer piezoelectric element 1 can be increased even further.

At this time, it is preferable that the pore 101 provided as an open pore is semicircular or semielliptical in section when viewed perpendicularly to the side surface of the stacked body 2. Moreover, as shown in FIG. 9, by configuring the pore 101 to have a semicircular or semielliptical sectional profile, it is possible to lessen the restraint force while keeping the strength of bonding between the external electrode layer 3a, 3b and the external electrode plate 5a, 5b.

Moreover, as shown in FIGS. 7 to 9, it is desirable to make the width of the pore 101 in the stacking direction coincide with the width of the hole 52 in the stacking direction. Note that a width in the stacking direction of the pore 101 refers to a maximum of the width (diameter) thereof in the stacking direction. Given that the pore 101 has a spherical shape, then the diameter of the sphere represents the width in the stacking direction, and, given that the pore 101 is semicircular or semielliptical in section when viewed perpendicularly to the side surface of the stacked body 2 as shown in FIG. 9, then the width of the pore opening represents the width in the stacking direction. By making the width in the stacking direction of the pore 101 coincide with the width in the stacking direction of the hole 52, it is possible to lessen the restraint force while keeping the strength of bonding between the external electrode layer 3a, 3b and the external electrode plate 5a, 5b.

Moreover, as shown in FIGS. 7 and 8, it is preferable that the pore 52 is provided in a midportion of the hole 52 in a width direction parallel to the extension direction of the slit 51. As the stacked body 2 undergoes extension and contraction, the external electrode plate 5a, 5b is subjected to a stress acting to cause the hole 52 to get distorted greatly at its midportion. In this regard, by locating the pore 101 in the midportion of the hole 52, it is possible to lessen the restraint force effectively.

Figure 10:
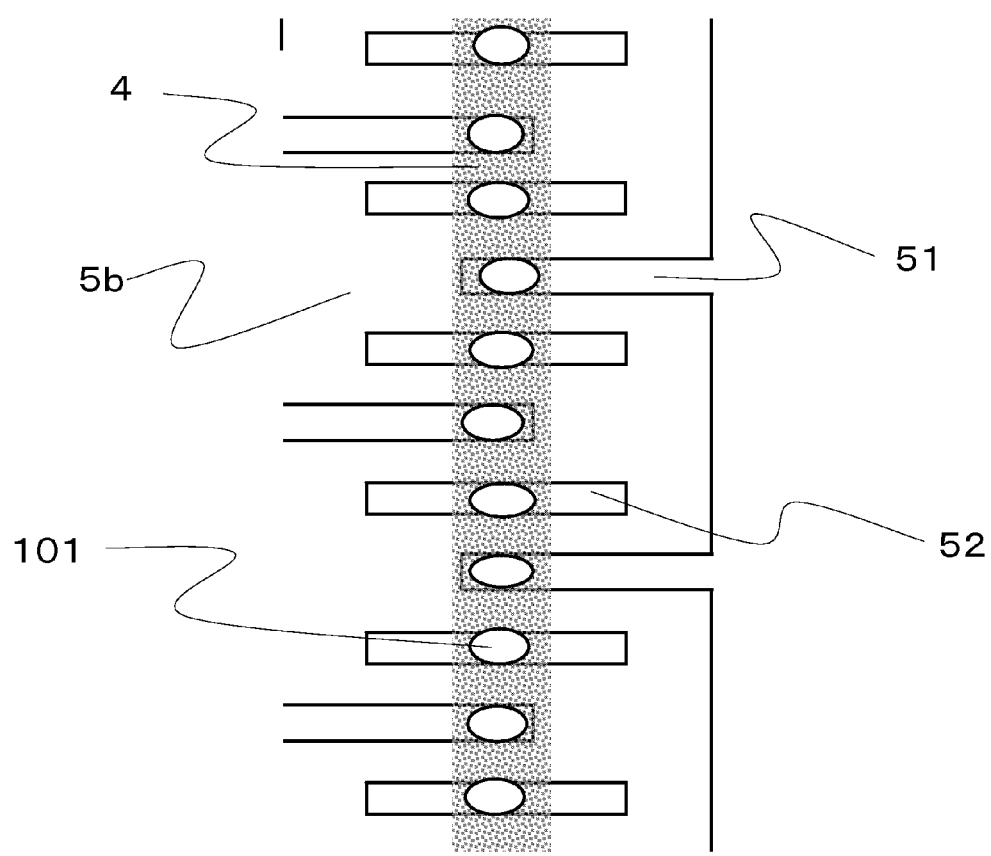
FIG. 10 is an explanatory view showing another example of the external electrode plate and the electrically conducting bonding material shown in FIG. 7.

Moreover, as shown in FIG. 10, in the case where the electrically conducting bonding material 4 lies within the portion of the external electrode plate where the tips of the respective slits 51 overlap each other alternately, it is preferable that the electrically conducting bonding material 4 lying inside the slit 51 is provided with the pore 101. By providing the pore 101 not only in the hole 52 but also in the slit 51, it is possible to obtain an even greater restraint-force lessening effect.

Further, as shown in FIGS. 7 and 9, in the case of providing the to-be-broken layer 23 which is preferentially broken rather than the internal electrode layer 22a, 22b during driving, it is preferable that the pore 101 is provided in a portion of the electrically conducting bonding material corresponding to the to-be-broken layer 23. By bringing the position of the hole 52 into correspondence with the position of the to-be-broken layer 23, and also by bringing the position of the pore 101 into correspondence with the position of the to-be-broken layer 23, it is possible to cause cracks 102, which develops from the to-be-broken layer 23 toward the electrically conducting bonding material 4, to develop selectively on part of the electrically conducting bonding material 4 which is thinned due to the presence of the pore 101, and thereby suppress development of cracks in the external electrode plate 5a, 5b. This helps suppress separation of the external electrode plate 5a, 5b.

It should be understood that the application of the invention is not limited to the specific embodiments described heretofore, and that various changes and modifications are possible without departing from the gist of the invention. For example, in the above-described example, a single external electrode plate 5a, 5b is provided on each of the opposed two side surfaces of the stacked body 2. Alternatively, two external electrode plates 5a, 5b may be provided on the adjacent side surfaces of the stacked body 2, or may be provided on one and the same side surface of the stacked body 2. Moreover, the section of the stacked body 2 in a direction perpendicular to the stacking direction may have, instead of a rectangular shape as practiced in the above-described embodiment, a polygonal shape such as a hexagonal or octagonal shape, a circular shape, or a shape defined by a combination of a straight line and an arc.

For example, the multi-layer piezoelectric element 1 of this embodiment is used for a piezoelectric driving element (piezoelectric actuator), a pressure sensor element, a piezoelectric circuit element, and so forth. Examples of the driving element include a fuel injection device for an automotive engine, a liquid injection device such as an ink-jet system, a precise positioning apparatus such as an optical apparatus, and an anti-vibration apparatus. Examples of the sensor element include a combustion pressure sensor, a knocking sensor, an acceleration sensor, a load sensor, an ultrasound sensor, a pressure-detecting sensor, and a yaw-rate sensor. Examples of the circuit element include a piezoelectric gyroscope, a piezoelectric switch, a piezoelectric transformer, and a piezoelectric breaker.

Next, a method for manufacturing the multi-layer piezoelectric element 1 of this embodiment will be described.

To begin with, ceramic green sheets constituting the piezoelectric layers 21 are prepared. Specifically, calcined powder of piezoelectric ceramics, a binder made of an organic polymer, and a plasticizer are mixed to prepare a ceramic slurry. The ceramic slurry is shaped into ceramic green sheets by a tape molding technique such as the doctor blade method or the calender roll method.

The piezoelectric ceramic may be of any given type so long as it has piezoelectric property. For example, a perovskite-type oxide made of lead zirconate titanate (PZT: $PbZrO_3$—$PbTiO_3$) can be used. Moreover, as the binder, an organic polymer such as acrylic polymer or butyral polymer can be used. Further, as the plasticizer, dibutyl phthalate (DBP), dioctyl phthalate (DOP), or the like can be used.

Next, an electrically conducting paste constituting the internal electrode layer 22a, 22b is prepared. Specifically, the electrically conducting paste is prepared by admixing a binder and a plasticizer in metal powder of a silver-palladium alloy. The electrically conducting paste is applied on to the above-described ceramic green sheets in a specific pattern of the internal electrode layer 22a, 22b by the screen printing technique.

In the case where the stacked body 2 includes the to-be-broken layer 23, when the to-be-broken layer 23 is made of a metal material, for example, an electrically conducting paste for to-be-broken layer is prepared by admixing a binder and a plasticizer in metal powder that is higher in silver content than an electrically conducting paste for internal electrode layer. At this time, any one of a mixture of silver powder and palladium powder, powder of a silver-palladium alloy, and the electrically conducting paste for internal electrode layer in admixture with silver powder can be used. The electrically conducting paste for to-be-broken layer is applied onto other ceramic green sheets than those bearing the pattern of the internal electrode layer 22a, 22b by the screen printing technique.

Then, a plurality of ceramic green sheets with the electrically conducting paste printed thereon are stacked on top of each other. At this time, the ceramic green sheets bearing the electrically conducting paste for to-be-broken layer are interposed at a predetermined interval. The resultant body is subjected to binder removal treatment at a predetermined temperature, and is whereafter fired at a temperature in a range of 900 to 1200° C. In this way, there is fabricated the stacked body 2 composed of piezoelectric layers 21 and internal electrode layers 22a, 22b which are stacked alternately.

It is noted that the way of producing the stacked body 2 is not limited to the method thus far described, and the stacked body 2 can therefore be produced by any given manufacturing method so long as it allows formation of the stacked body 2 composed of a stack of a plurality of piezoelectric layers 21 and internal electrode layers 22a, 22b. A method may be adopted that involves a step of manufacturing a single divisible stacked body and a step of cutting the stacked body into pieces of predetermined shape as stacked bodies 2.

Next, the stacked body 2 obtained through the firing process is ground into predetermined configuration by means of a surface grinder or otherwise.

After that, the external electrode layer 3a, 3b is prepared by applying an electrically conducting paste made of silver and glass to a side surface of the stacked body 2. The electrically conducting paste is prepared by admixing a binder, a plasticizer, glass powder, and so forth in metal powder composed predominantly of silver. The electrically conducting paste, after being printed on to the side surface of the stacked body 2 by means of screen printing or otherwise, is fired at a temperature of 600 to 800° C. In this way, the external electrode layer 3a, 3b can be prepared.

Next, the electrically conducting bonding material 4 in slurry form in which conductor-made fillers are substantially dispersed in thermosetting resin, is applied to the upper surface of the external electrode layer 3a, 3b, and the external electrode plate 5a, 5b is bonded thereto. After that, the electrically conducting bonding material 4 is dried at a temperature of 100 to 140° C. range, and is subsequently cured at a temperature of 180 to 220° C., whereupon the external electrode plate 5a, 5b is fixed in place.

The external electrode plate 5a, 5b is provided with a plurality of slits 51 which extend from the opposite long sides toward the center thereof in such a manner that tips of the respective slits 51 overlap each other alternately when viewed in the stacking direction of the stacked body. The portion of the external electrode plate where the tips of the respective slits 51 overlap each other alternately is provided with the hole 52 extending along the extension direction of the slit 51. The external electrode plate 5a, 5b is obtained by a method involving a step of making a platy body of metal such as stainless steel or phosphor bronze by means of press molding, etching, or otherwise, a step of providing the slits 51 in the platy body by means of press molding, etching, or otherwise, and a step of providing the holes 52 therein by means of press molding, etching, or otherwise.

At this time, adjustment can be made as appropriate. That is, each of the opposite ends of the hole 52 in the extension direction of the slit 51 may be adjusted to lie midway between the tip of the slit 51 and the long side of the external electrode plate 5a, 5b opposed to the tip when viewed in the stacking direction of the stacked body 2, and, each of the width of the hole 52 in the stacking direction of the stacked body 2 and the width of the slit 51 in the stacking direction of the stacked body 2 may be adjusted to be greater than the distance between the slit 51 and the hole 52.

Meanwhile, as the thermosetting resin constituting the electrically conducting bonding material 4, polyamide, polyimide, or the like is used. As the conductor-made filler, nickel, silver, platinum, gold, or the like are used. In particular, silver is desirable for use, because it exhibits low resistance and is highly resistant to oxidation.

In addition to being interposed between the external electrode layer 3a, 3b and the external electrode plate 5a, 5b, the electrically conducting bonding material 4 may have the following configuration.

Specifically, the electrically conducting bonding material 4 may be placed between the external electrode layer 3a, 3b and the external electrode plate 5a, 5b so as to extend, through the hole 52 and the portion of the external electrode plate where the tips of the respective slits 51 overlap each other alternately, outward beyond the external electrode plate 5a, 5b. Such a configuration can be achieved by increasing the amount of the electrically conducting bonding material 4.

Moreover, the electrically conducting bonding material 4 may be so configured that one part lies between the external electrode layer 3a, 3b and the external electrode plate 5a, 5b and the other part lies outside the external electrode plate 5a, 5b, and these parts merge through the hole 52 and the portion of the external electrode plate where the tips of the respective slits 51 overlap each other alternately. Such a configuration can be achieved by increasing the amount of the electrically conducting bonding material 4, yet trimming an excess of the electrically conducting bonding material 4 protruding outside the external electrode plate 5a, 5b by means of a squeegee or otherwise. Preferably, after the application of the electrically conducting bonding material 4, the external electrode plate 5a, 5b is bonded thereto, and the electrically conducting bonding material 4 is applied again to the exterior of the external electrode plate 5a, 5b, and is then dried and cured.

At this time, it is advisable that the electrically conducting bonding material 4 is applied in a width smaller than the width of the external electrode plate 5a, 5b. Thereby, the electrically conducting bonding material 4 can extend along the center of the external electrode plate 5a, 5b while covering the portion of the external electrode plate where the hole 52 and the tip of the slit 51 overlap each other, with part of the slit 51 located near the long side of the external electrode plate exposed.

In the case of providing the pore 101 in the electrically conducting bonding material 4 lying inside the hole 52, the pore 101 can be provided either by performing, after the application of the electrically conducting bonding material 4 in slurry form, suction on only the part of the electrically conducting bonding material corresponding to the hole 52, or by making adjustment to, for example, application pressure so that the part of the electrically conducting bonding material corresponding to the hole 52 is free of the application. Moreover, by lowering the thixotropy level of the electrically conducting bonding material 4 in slurry form, it is possible to provide the pore 101 in the part of the electrically conducting bonding material corresponding to the hole 52 during the dry-curing process.

For example, by setting the spaced interval between the to-be-broken layers 23 at a value equivalent to a multiple of the spaced interval between the holes 52, it is possible to bring the position of the hole 52 into correspondence with the position of the to-be-broken layer 23, as well as to bring the position of the pore 101 into correspondence with the position of the to-be-broken layer 23.

Next, an external lead member 8 is fixedly connected to the surface of the external electrode plate 5a, 5b via solder 9.

After that, the stacked body 2 connected with the external lead member 8 is immersed in a resin solution containing silicone resin which constitutes exterior resin (not shown). Then, the resin solution is subjected to vacuum degassing treatment to cause the silicone resin to adhere tightly to an outer periphery of the stacked body 2, and subsequently the stacked body 2 is pulled out of the resin solution. In this way, a silicone resin layer is coated on the side surface of the stacked body 2 formed with the external electrode plate 5a, 5b whose surface is fixedly connected with the external lead member 8.

After that, a DC electric field of 0.1 to 3 kV/mm is applied to the external lead member 8 connected to each of the paired external electrode plates 5a and 5b by means of soldering or otherwise to initiate polarization in the piezoelectric layers 21 constituting the stacked body 2. In this way, the construction of the multi-layer piezoelectric element 1 is completed.

In the multi-layer piezoelectric element 1 thus obtained, the external electrode plate 5a, 5b is connected to an external power source via the external lead member 8, and, upon the application of voltage, each of the piezoelectric layers 21 undergoes significant displacement under an inverse piezoelectric effect. Thus, the multi-layer piezoelectric element is capable of functioning as, for example, an automotive fuel injection valve for injecting fuel into an engine.

Next, one embodiment of an injection device according to the invention will be described.

Figure 11:
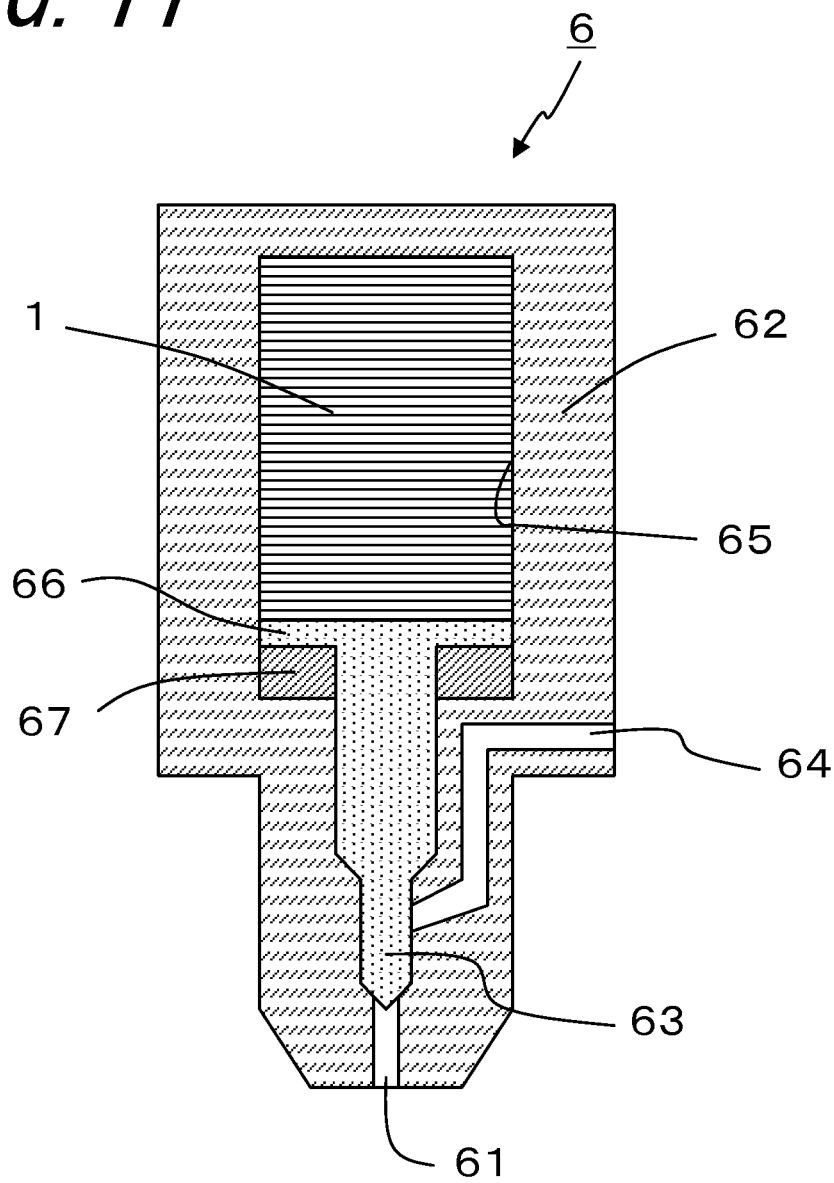
FIG. 11 is a schematic sectional view showing an embodiment of an injection device according to the invention.

FIG. 11 is a schematic sectional view showing the injection device in accordance with one embodiment of the invention. As shown in FIG. 11, an injection device 6 of this embodiment includes a housing 62 including an injection hole 61 at one end thereof and the above-described multi-layer piezoelectric element 1 placed within the housing 62.

In an interior of the housing 62 is disposed a needle valve 63 capable of opening and closing of the injection hole 61 by driving the multi-layer piezoelectric element 1. A fluid passage 64 is so disposed as to be capable of communicating with the injection hole 61 in accordance with the movement of the needle valve 63. The fluid passage 64 is coupled to an external fuel supply source, so that a fuel is supplied to the fluid passage 64 under high pressure at all times. Therefore, when the needle valve 63 is operated to open the injection hole 61, then a fluid (for example, fuel) which has been fed through the fluid passage 64 is injected to an adjacent container (for example, a fuel chamber) (not shown).

Moreover, an upper end of the needle valve 63 is a piston 66 which can slide along a cylinder 65 which has an increased inner diameter and is provided in the housing 62. Furthermore, the above-described multi-layer piezoelectric element 1 is placed within the housing 62 in contact with the piston 66.

In the injection device 6 thus constructed, upon extension of the multi-layer piezoelectric element 1 entailed by application of voltage, the piston 66 is pushed forward, thus causing the needle valve 63 to close the injection hole 61 with a consequent halt on supply of fuel. Further, upon stopping the application of voltage, the multi-layer piezoelectric element 1 is contracted, and a disc spring 67 pushes the piston 66 backward. In consequence, the injection hole 61 communicates with the fluid passage 64 so that injection of fuel is carried out.

It is noted that the injection device may be so designed that the fluid passage 64 is opened by applying a voltage to the multi-layer piezoelectric element 1, and is contrariwise closed upon a halt on the application of voltage. Moreover, the injection device 6 of this embodiment may include a housing 62 including an injection hole 61 and the multi-layer piezoelectric element 1 according to the embodiment, wherein a fluid stored in the housing 62 is configured to be injected through the injection hole by driving the multi-layer piezoelectric element 1. That is, the multi-layer piezoelectric element 1 does not necessarily have to be placed within the housing 62. It is sufficient only that a pressure for control of fluid injection is applied to the interior of the housing 62 by driving the multi-layer piezoelectric element 1. In the injection device 6 of this embodiment, the term "fluid" is construed as encompassing not only fuel and ink, but also various liquid fluid such as a conductive paste, and gases. The use of the injection device 6 of this embodiment makes it possible to control a flow rate of fluid and timing of fluid injection with stability for a long period of time.

Particularly, when using the injection device 6 of this embodiment in an internal combustion engine, a fuel can be precisely injected into a combustion chamber of an engine or like for a longer period of time compared with a conventional injection device.

Next, an example of a fuel injection system according to an embodiment of the invention will be described.

Figure 12:
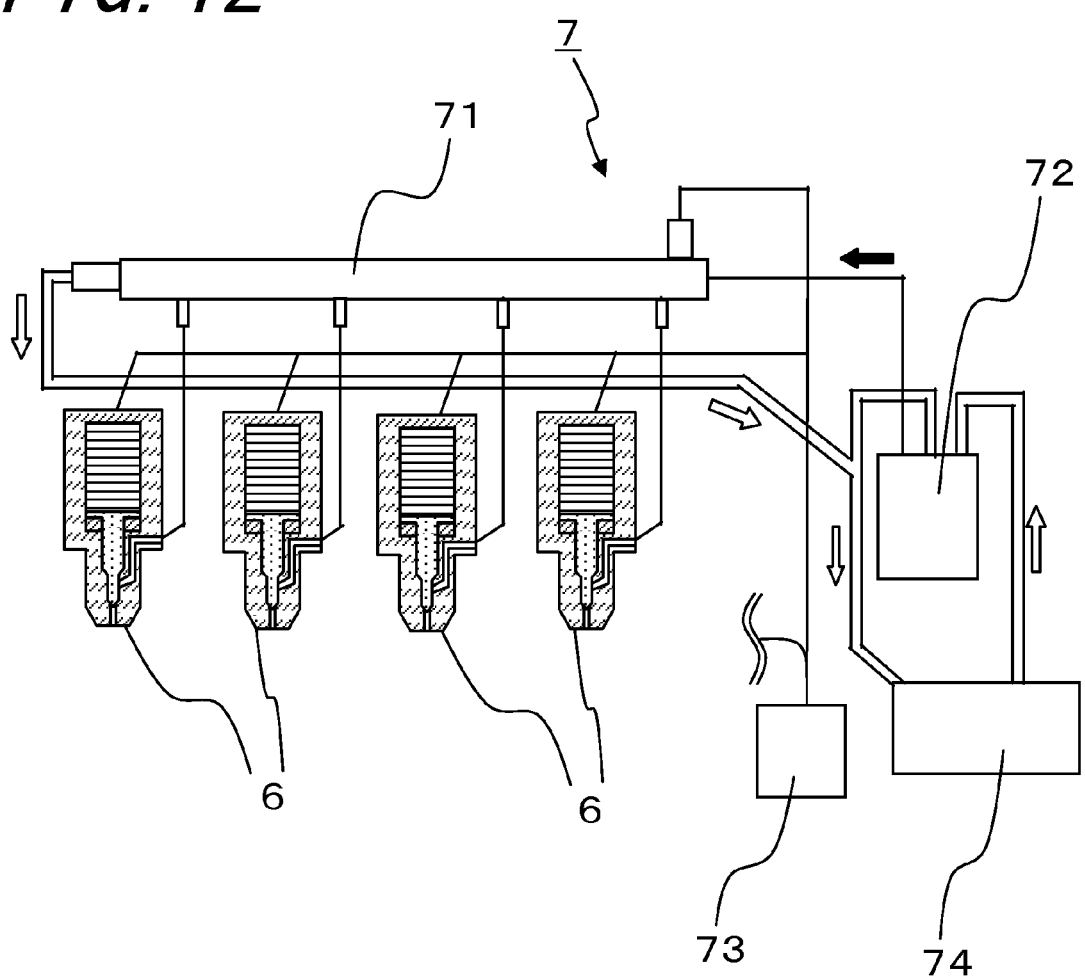
FIG. 12 is a schematic block diagram showing an embodiment of a fuel injection system according to the invention.

FIG. 12 is a schematic diagram showing the fuel injection system according to an embodiment of the invention. As shown in FIG. 12, a fuel injection system 7 according to the embodiment of the invention includes a common rail 71 configured to store a high-pressure fuel, a plurality of injection devices 6 each configured to inject a high-pressure fluid (high-pressure fuel) stored in the common rail 71, a pressure pump 72 configured to supply the high-pressure fluid (high-pressure fuel) to the common rail 71, and an injection control unit 73 configured to send a drive signal to the injection device 6.

The injection control unit 73 controls an amount of injection of the high-pressure fluid and timing of fluid injection on the basis of external information or external signals. For example, in the case of using the injection control unit 73 for injection of fuel into an engine, it is possible to control the amount of fuel injection and the timing of fuel injection while detecting the condition of the interior of the combustion chamber of the engine by a sensor or the like.

The pressure pump 72 plays a role of supplying a fluid from a fluid tank 74 (fuel tank) to the common rail 71 under high pressure. For example, in the fuel injection system 7 for use in engine application, the fluid is fed to the common rail 71 under high pressure of about 1000 to 2000 atmospheres (about 101 MPa to about 203 MPa), and preferably high pressure of about 1500 to 1700 atmospheres (about 152 MPa to about 172 MPa).

The common rail 71 stores therein the fluid (fuel) from the pressure pump 72 and acts to feed it to the injection device 6 on an as needed basis. The injection device 6 injects fluid in a certain amount to the exterior of the device or into an adjacent container through the injection hole 61. For example, in the case where an engine is a target of fuel supply by injection, high-pressure fuel in fine-spray form is injected into the combustion chamber of the engine through the injection hole 21.

When using the fuel injection system 7 of this embodiment, it is possible to stably inject the high pressure fuel as desired for a longer period of time than the case of a conventional fuel injection system.

EXAMPLES

Hereinafter, examples of the multi-layer piezoelectric element of the invention will be described.

To begin with, a ceramic slurry was prepared by mixing calcined powder of piezoelectric ceramics composed predominantly of lead zirconate titanate (PZT: $PbZrO_3$—$PbTiO_3$) having an average particle size of 0.4 μm, an acrylic binder, and a plasticizer made of DBP (dibutyl phthalate). The ceramic slurry has been shaped into 100 μm-thick ceramic green sheets constituting piezoelectric layers by the doctor blade method. Moreover, an electrically conducting paste constituting internal electrode layers was prepared by adding an organic binder to a silver-palladium alloy.

Next, the electrically conducting paste constituting internal electrode layers was printed on one side of the ceramic green sheet by the screen printing technique, and 300 ceramic green sheets with the electrically conducting paste printed on them were stacked on top of each other. The resultant body was fired for 5 hours at a temperature of 1100° C., whereupon a stacked body was obtained. The stacked body thus obtained has been ground into a predetermined shape with use of a surface grinder.

Next, an electrically conducting paste composed of silver-made metal powder in admixture with an organic binder, a plasticizer, glass powder, and so forth was applied to a side surface of the stacked body by the screen printing technique, and was fired for 2 hours at a temperature of 800° C. In this way, an external electrode layer was obtained.

Next, an electrically conducting bonding material composed of polyimide resin containing silver fillers in a dispersed state was applied to the surface of the external electrode layer, and the external electrode plate was placed thereon. Then, the electrically conducting bonding material was applied again on to the external electrode plate. After that, the electrically conducting bonding material was dried at a temperature of 100° C. and then cured at a temperature of 200° C., whereupon the external electrode plate was fixed in place.

Next, the lead member was fixedly connected to the surface of the external electrode plate via silver-blended tin-lead alloy-based solder having a working temperature (melting point) of 300° C.

Next, the stacked body was immersed in a resin solution containing silicone resin, so that a coating of silicone resin was applied to the side surface of the stacked body including the surface of the external electrode plate.

Thus, a multi-layer piezoelectric element was fabricated through the process steps as above described.

It is noted that there were prepared external electrode plates of 6 different patterns as shown in FIGS. 3(a) to 3(f), each of which has a width of 1 mm and a plate thickness of 0.05 mm.

In FIG. 3(a), there is shown an external electrode plate implemented as a comparative example that is provided with a plurality of 0.6 mm-long, 0.12 mm-wide slits which extend from the opposite long sides toward the center thereof in such a manner that tips of the respective slits overlap each other alternately when viewed in the stacking direction of the stacked body. No hole is provided in the portion of the external electrode plate where the tips of the respective slits overlap each other alternately. The spaced interval between the slits is set at 0.1 mm.

In FIG. 3(b), there is shown an external electrode plate provided with a plurality of 0.6 mm-long, 0.12 mm-wide slits which extend from the opposite long sides toward the center thereof in such a manner that tips of the respective slits overlap each other alternately when viewed in the stacking direction of the stacked body. The portion of the external electrode plate where the tips of the respective slits overlap each other alternately is provided with a hole extending along the extension direction of the slit. The length of the major axis of the hole is set at 0.3 mm, and the width of the hole is set at 0.12 mm. The opposite ends of the hole in the extension direction of the slit are each situated at the same position as the tip of the slit when viewed in the stacking direction of the stacked body. The spaced interval between the slit and the hole is set at 0.1 mm.

In FIG. 3(c), there is shown an external electrode plate provided with a plurality of 0.6 mm-long, 0.12 mm-wide slits which extend from the opposite long sides toward the center thereof in such a manner that tips of the respective slits overlap each other alternately when viewed in the stacking direction of the stacked body. The portion of the external electrode plate where the tips of the respective slits overlap each other alternately is provided with a hole extending along the extension direction of the slit. The opposite ends of the hole in the extension direction of the slit are each located midway between the tip of the slit and the long side of the external electrode plate opposed to that tip when viewed in the stacking direction of the stacked body. The length of the major axis of the hole is set at 0.6 mm, and the width of the hole is set at 0.12 mm. The spaced interval between the slit and the hole is set at 0.1 mm.

In FIG. 3(d), there is shown an external electrode plate provided with a plurality of 0.6 mm-long, 0.12 mm-wide slits which extend from the opposite long sides toward the center thereof in such a manner that tips of the respective slits overlap each other alternately when viewed in the stacking direction of the stacked body. The portion of the external electrode plate where the tips of the respective slits overlap each other alternately is provided with a hole extending along the extension direction of the slit. The opposite ends of the hole in the extension direction of the slit are each located midway between the tip of the slit and the long side of the external electrode plate opposed to that tip when viewed in the stacking direction of the stacked body. The hole may have its major axis inclined at 5 degrees with respect to a direction perpendicular to the stacking direction. The length of the major axis of the hole is set at 0.6 mm, and the width of the hole is set at 0.12 mm. The spaced interval between the slit and the hole is set at 0.1 mm.

In FIG. 3(e), there is shown an external electrode plate provided with a plurality of 0.6 mm-long, 0.06 mm-wide slits which extend from the opposite long sides toward the center thereof in such a manner that tips of the respective slits overlap each other alternately when viewed in the stacking direction of the stacked body. The portion of the external electrode plate where the tips of the respective slits overlap each other alternately is provided with a hole extending along the extension direction of the slit. The opposite ends of the hole in the extension direction of the slit are each located midway between the tip of the slit and the long side of the external electrode plate opposed to that tip when viewed in the stacking direction of the stacked body. The slit, as well as the hole, is made smaller in width than that shown in FIG. 3(b). The length of the major axis of the hole is set at 0.6 mm, and the width of the hole is set at 0.06 mm. The spaced interval between the slit and the hole is set at 0.16 mm.

In FIG. 3(f), there is shown an external electrode plate provided with a plurality of 0.6 mm-long, 0.12 mm-wide slits which extend from the opposite long sides toward the center thereof in such a manner that tips of the respective slits overlap each other alternately when viewed in the stacking direction of the stacked body. The portion of the external electrode plate where the tips of the respective slits overlap each other alternately is provided with a hole extending along the extension direction of the slit. Note that two holes are provided between the slits. The major-axis length and the width of each of the holes are set at 0.2 mm and 0.12 mm, respectively. The spaced interval between the holes is set at 0.2 mm. The spaced interval between the slit and the hole is set at 0.1 mm.

As shown in FIGS. 3(a) to 3(f), in each of the external electrode plates of different patterns, the electrically conducting bonding material was applied to the midportion, with other region located near the long side exposed.

In each of the multi-layer piezoelectric elements thus fabricated, a DC electric field of 3 kV/mm was applied to the external electrode plate via the external lead member for 15 minutes to effect polarization. Upon the application of DC voltage of 160 V on the multi-layer piezoelectric elements, a displacement of 40 μm took place in the stacking direction of the stacked body.

Then, as durability tests, the multi-layer piezoelectric elements have been experimentally driven continuously $1 \times 10^8$ times at ambient temperature under application of AC voltage ranging from 0 V to +160 V with a frequency of 150 Hz. As a result, in the multi-layer piezoelectric element employing the external electrode plate shown in FIG. 3(a), cracks were developed in the electrically conducting bonding material and consequently electric discharge and burnout of the electrically conducting bonding material were observed. On the other hand, in the multi-layer piezoelectric elements employing the external electrode plates shown in FIGS. 3(b) to 3(f), respectively, no cracks were developed in the electrically conducting bonding material and therefore neither electric discharge nor burnout of the electrically conducting bonding material was observed.

Moreover, in each of the multi-layer piezoelectric elements thus fabricated, following the completion of $1 \times 10^8$ cycles of continuous driving, the distance from the long side of the external electrode plate to the stacked body (the amount of warpage) was measured with use of a feeler gage. As a result, it has been confirmed that the multi-layer piezoelectric elements employing the external electrode plates shown in FIGS. 3(b) to 3(f), respectively, are obviously smaller than the multi-layer piezoelectric element employing the external electrode plate shown in FIG. 3(a) in respect of the distance from the long side of the external electrode plate to the stacked body (the amount of warpage). It has also been confirmed that the multi-layer piezoelectric elements employing the external electrode plates shown in FIGS. 3(c) and 3(d), respectively, are smaller than the multi-layer piezoelectric element employing the external electrode plates shown in FIGS. 3(b) and 3(e), respectively, in respect of the distance from the long side of the external electrode plate to the stacked body (the amount of warpage).

Next, in a manner similar to that as above described, a stacked body composed of a stack of 300 ceramic green sheets was prepared.

Likewise, an external electrode layer, an external electrode plate, and an electrically conducting bonding material were provided therein. The external electrode plate has a form as shown in FIG. 3(b). Moreover, a pore was created in the electrically conducting bonding material applied to the hole under the condition where the thixotropy level of the electrically conducting bonding material (the ratio between viscosity at 0.5 $min^{-1}$ and viscosity at 5.0 $min^{-1}$ as observed in measurement using E-type viscometer of 3°-cone) was set at 2.5. In this way, a multi-layer piezoelectric element was fabricated. The width of the pore thus provided in the stacking direction was equal to the width of the hole, and the pore had a semielliptical sectional profile.

In the multi-layer piezoelectric elements thus obtained, a comparison was made between the case of providing the pore in the electrically conducting bonding material of the form shown in FIG. 3(b) lying in the hole and the case of providing no pore therein. As a result, it has been confirmed that the multi-layer piezoelectric element formed with the pore is smaller than that devoid of the pore in respect of the distance from the long side of the external electrode plate to the stacked body (the amount of warpage).

Reference Signs List
- 1: Multi-layer piezoelectric element
- 2: Stacked body
- 21: Piezoelectric layer
- 22a, 22b: Internal electrode layer
- 23: To-be-broken layer
- 3a, 3b: External electrode layer
- 4: Electrically conducting bonding material
- 5a, 5b: External electrode plate
- 51: Slit
- 52: Hole
- 6: Injection device
- 61: Injection hole
- 62: Housing
- 63: Needle valve
- 64: Fluid passage
- 65: Cylinder
- 66: Piston
- 67: Disc spring
- 7: Fuel injection system
- 71: Common rail
- 72: Pressure pump
- 73: Injection control unit
- 74: Fluid tank
- 8: External lead member
- 9: Solder
- 101: Pore
- 102: Crack

The invention claimed is:

1. A multi-layer piezoelectric element, comprising:
a stacked body including piezoelectric layers and internal electrode layers, the piezoelectric layers and the internal electrode layers being stacked;
an external electrode layer attached to a side surface of the stacked body, the external electrode layer being elongated in a stacking direction of the stacked body, the external electrode layer being electrically connected with ends of the internal electrode layers which are exposed on the side surface; and
an external electrode plate bonded to the external electrode layer therealong by an electrically conducting bonding material, wherein
the external electrode plate is provided with a plurality of slits which extend from opposite long sides of the external electrode plate toward a center thereof in such a manner that tips of the respective slits overlap each other alternately when viewed in the stacking direction of the stacked body, and
a portion of the external electrode plate where the tips of the respective slits overlap each other alternately is provided with a hole extending along an extension direction of the slit.

2. The multi-layer piezoelectric element according to claim 1, wherein opposite ends of the hole along the extension direction of the slit are each located midway between the tip of the slit and the long side of the external electrode plate opposed to the tip when viewed in the stacking direction of the stacked body.

3. The multi-layer piezoelectric element according to claim 1, wherein a width of the hole in the stacking direction and a width of the slit in the stacking direction are each greater than a distance between the slit and the hole.

4. The multi-layer piezoelectric element according to claim 1, wherein the electrically conducting bonding material is so configured that one part lies between the external electrode layer and the external electrode plate and the other part lies outside the external electrode plate, and these parts merge through the hole and the portion of the external electrode plate where the tips of the respective slits overlap each other alternately.

5. The multi-layer piezoelectric element according to claim 4, wherein the electrically conducting bonding material extends along the center of the external electrode plate while covering the hole and the portion of the external electrode plate where the tips of the respective slits overlap each other alternately, and part of the slit located near the long side is not covered with the electrically conducting bonding material.

6. The multi-layer piezoelectric element according to claim 1, wherein the electrically conducting bonding material is placed between the external electrode layer and the external electrode plate, and the electrically conducting bonding material extends through the hole and the portion of the external electrode plate where the tips of the respective slits overlap each other alternately, outward beyond the external electrode plate.

7. The multi-layer piezoelectric element according to claim 1, wherein the electrically conducting bonding material lies inside the hole, and the electrically conducting bonding material lying inside the hole is provided with a pore.

8. The multi-layer piezoelectric element according to claim 7, wherein the pore is an open pore.

9. The multi-layer piezoelectric element according to claim 8, wherein the pore is semicircular or semielliptical in section when viewed perpendicularly to the side surface of the stacked body.

10. The multi-layer piezoelectric element according to claim 7, wherein a width of the pore in the stacking direction is equal to a width of the hole in the stacking direction.

11. The multi-layer piezoelectric element according to claim 7, wherein the pore is provided in a midportion of the hole in a width direction parallel to the extension direction of the slit.

12. The multi-layer piezoelectric element according to claim 7, wherein the electrically conducting bonding material lies within the portion of the external electrode plate where the tips of the respective slits overlap each other alternately, and the electrically conducting bonding material lying inside the slit is provided with a pore.

13. The multi-layer piezoelectric element according to claim 7, wherein the stacked body comprises a to-be-broken layer which is preferentially broken rather than the internal electrode layer during driving, and the pore is provided in a portion of the electrically conducting bonding material corresponding to the to-be-broken layer.

14. An injection device, comprising:
a container comprising an injection hole; and
the multi-layer piezoelectric element according to claim 1,
a fluid stored in the container being configured to be injected through the injection hole by driving the multi-layer piezoelectric element.

15. A fuel injection system, comprising:
a common rail configured to store a high-pressure fuel;
the injection device according to claim 14, configured to inject the high-pressure fuel stored in the common rail;
a pressure pump configured to supply the high-pressure fuel to the common rail; and
an injection control unit configured to send a drive signal to the injection device.

* * * * *